(12) United States Patent
Wang et al.

(10) Patent No.: US 11,581,903 B2
(45) Date of Patent: Feb. 14, 2023

(54) DATA COMPRESSION METHOD AND APPARATUS, COMPUTER-READABLE STORAGE MEDIUM, AND ELECTRONIC DEVICE

(71) Applicant: Beijing Horizon Information Technology Co., Ltd., Beijing (CN)

(72) Inventors: Zhenjiang Wang, Beijing (CN); Jianjun Li, Beijing (CN); Zhuoran Zhao, Beijing (CN); Chang Huang, Beijing (CN)

(73) Assignee: Beijing Horizon Information Technology Co., Ltd., Beijing (CN)

( * ) Notice: Subject to any disclaimer, the term of this patent is extended or adjusted under 35 U.S.C. 154(b) by 0 days.

(21) Appl. No.: 17/526,335

(22) Filed: Nov. 15, 2021

(65) Prior Publication Data

US 2022/0182072 A1    Jun. 9, 2022

(30) Foreign Application Priority Data

Dec. 8, 2020    (CN) .................. 202011420383.X

(51) Int. Cl.
*H03M 7/00*    (2006.01)
*H03M 7/34*    (2006.01)
*H03M 7/30*    (2006.01)

(52) U.S. Cl.
CPC ....... *H03M 7/3066* (2013.01); *H03M 7/6011* (2013.01)

(58) Field of Classification Search
CPC ............ H03M 7/3066; H03M 7/6011; H03M 7/3059; G06F 16/1744; G06F 16/116
USPC ...................................... 341/50, 51
See application file for complete search history.

(56) References Cited

U.S. PATENT DOCUMENTS

| 4,868,570 | A | * | 9/1989 | Davis ..................... H03M 7/42 209/584 |
| 6,226,325 | B1 | * | 5/2001 | Nakamura ....... G11B 20/00007 375/240 |
| 2020/0304146 | A1 | * | 9/2020 | Stenström ............... H03M 7/40 |

* cited by examiner

*Primary Examiner* — Jean B Jeanglaude
(74) *Attorney, Agent, or Firm* — Bret E. Field; Bozicevic, Field & Francis LLP

(57) ABSTRACT

Disclosed are a data compression method, a computer-readable storage medium, and an electronic device. The method includes: converting each data in a to-be-compressed data set into binary data in a preset format; determining a to-be-compressed bit and a significant bit for the each data in the to-be-compressed data set based on a sequence of all bits of the binary data; determining a compression bit width corresponding to the to-be-compressed data set based on bit widths of the significant bits; compressing the each data in the to-be-compressed data set based on the compression bit width, to obtain a compressed data set; and generating attribute information of the compressed data set. According to the present disclosure, the significant bit can be determined based on the sequence of all bits without adjusting orders of the bits of the binary data, thereby simplifying a data compression process and improving efficiency of data compression.

20 Claims, 5 Drawing Sheets

DATA COMPRESSION METHOD AND APPARATUS, COMPUTER-READABLE STORAGE MEDIUM, AND ELECTRONIC DEVICE

CROSS-REFERENCES TO RELATED APPLICATION

The present application claims priority under 35 U.S.C. § 119(a) to Chinese patent application No. 202011420383.X, filed on Dec. 8, 2020, which is incorporated herein by reference in its entirety as set forth in full.

FIELD OF THE INVENTION

The present disclosure relates to the technical filed of computers, and in particular, to a data compression method and apparatus, a computer-readable storage medium, and an electronic device.

BACKGROUND OF THE INVENTION

With development of the computer technology, there are more and more scenarios for mass data processing, and thus demands for data storage space are increased. On this basis, data typically needs to be compressed while being stored. Data compression refers to a technical approach of reducing data volume without losing useful information to reduce storage space so as to improve data transmission efficiency, or reorganizing data according to a certain algorithm to reduce data redundancy and storage space.

For example, in a process of processing data for a prior neural network model, a large quantity of feature maps may be generated, where data volume of parameters such as a weight and an offset contained in the model is also very large. Therefore, there is a need of compressing the feature map and the parameter.

SUMMARY OF THE INVENTION

Embodiments of the present disclosure provide a data compression method and apparatus, a computer-readable storage medium, and an electronic device.

An embodiment of the present disclosure discloses a data compression method, where the method includes: converting each data in a to-be-compressed data set into binary data in a preset format; determining a to-be-compressed bit and a significant bit for the each data in the to-be-compressed data set based on a sequence of all bits of the binary data; determining a compression bit width corresponding to the to-be-compressed data set based on bit widths of the significant bits; compressing the each data in the to-be-compressed data set based on the compression bit width, to obtain a compressed data set; and generating attribute information of the compressed data set, where the attribute information is used to indicate an association relationship between the compressed data set and the to-be-compressed data set.

According to another aspect of an embodiment of the present disclosure, a data compression apparatus is provided, where the apparatus includes: a conversion module, configured to convert each data in a to-be-compressed data set into binary data in a preset format; a first determination module, configured to determine a to-be-compressed bit and a significant bit for the each data in the to-be-compressed data set based on a sequence of all bits of the binary data; a second determination module, configured to determine a compression bit width corresponding to the to-be-compressed data set based on bit widths of the significant bits; a compression module, configured to compress the each data in the to-be-compressed data set based on the compression bit width, to obtain a compressed data set; and a first generation module, configured to generate attribute information of the compressed data set, where the attribute information is used to indicate an association relationship between the compressed data set and the to-be-compressed data set.

According to another aspect of an embodiment of the present disclosure, a computer-readable storage medium is provided, in which a computer program is stored, where the computer program is used to implement the foregoing data compression method.

According to another aspect of an embodiment of the present disclosure, an electronic device is provided, where the electronic device includes: a processor; and a memory configured to store a processor-executable instruction, where the processor is configured to read the instruction from the memory, and execute the instruction to implement the foregoing data compression method.

According to the data compression method and apparatus, the computer-readable storage medium, and the electronic device that are provided in the foregoing embodiments of the present disclosure, the each data in the to-be-compressed data set is converted into the binary data in the preset format; the to-be-compressed bit and the significant bit are determined for the each data based on the sequence of the all bits of the binary data; the compression bit width corresponding to the to-be-compressed data set is determined based on the bit widths of each significant bits; the each data is compressed based on the compression bit width, to obtain the compressed data set; and the attribute information of the compressed data set is generated. In this way, the significant bit may be determined based on the sequence of the all bits without adjusting orders of the respective bits of the binary data. In this way, a data compression process is simplified, and efficiency of data compression is improved.

The technical solutions of the present disclosure are further described in detail below with reference to the accompanying drawings and embodiments.

BRIEF DESCRIPTION OF THE DRAWINGS

By describing the embodiments of the present disclosure more detailed with reference to the accompanying drawings, the foregoing and other objectives, features, and advantages of the present disclosure will become more apparent. The accompanying drawings, constituting a part of the specification, are provided for further understanding of the embodiments of the present disclosure and for explaining the present disclosure together with the embodiments of the present disclosure, and are not construed as limiting the present disclosure. In the accompanying drawings, same reference signs generally indicate same components or steps.

DETAILED DESCRIPTION OF THE EMBODIMENTS

Figure 1:
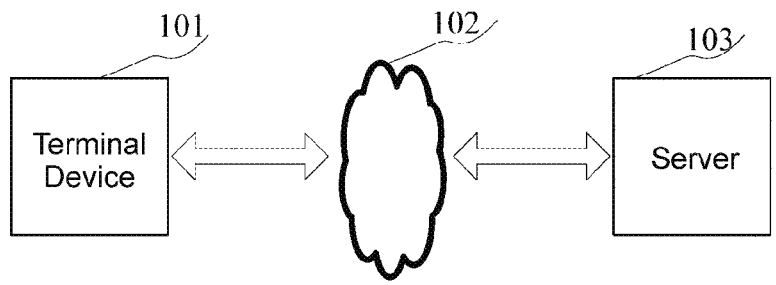
FIG. 1 is a diagram illustrating a system applicable to the present disclosure.

Exemplary embodiments of the present disclosure are described below in detail with reference to the accompanying drawings. Obviously, the described embodiments are merely a part, rather than all of embodiments of the present disclosure. It should be understood that the present disclosure is not limited by the exemplary embodiments described herein.

It should be noted that unless otherwise specified, the scope of the present disclosure is not limited by relative arrangement of components and steps, numeric expressions, and numerical values described in these embodiments.

A person skilled in the art may understand that terms such as "first" and "second" in the embodiments of the present disclosure are merely used to distinguish between different steps, devices, or modules, and indicate neither any particular technical meaning, nor necessarily logical ordering among them.

It should be further understood that, in the embodiments of the present disclosure, the term "multiple/a plurality of" may refer to two or more; and the term "at least one" may refer to one, two, or more.

It should be further understood that, a component, data, or structure involved in the embodiments of the present disclosure may be generally construed to one or more, unless clearly stated or the context indicates otherwise.

In addition, the term "and/or" in the present disclosure refers to only an association relationship that describes associated objects, indicating presence of three relationships. For example, A and/or B may indicate presence of three cases: A alone, both A and B, and B alone. In addition, the character "/" in the present disclosure generally indicates an "or" relationship of associated objects.

It should be further understood that, the descriptions of the various embodiments of the present disclosure focus on differences among the various embodiments. The same or similar parts among the embodiments may refer to one another. For concision, description is not repeated.

Meanwhile, it should be understood that, for ease of description, the accompanying drawings are not necessarily to scale in size of any of parts shown therein.

Descriptions of at least one exemplary embodiment below are actually illustrative only, and never serve as any limitation to the present disclosure along with application or use thereof.

Technologies, methods, and devices known by a person of ordinary skills in the related fields may not be discussed in detail herein. However, where appropriate, the technologies, the methods, and the devices shall be regarded as a part of the specification.

It should be noted that, similar signs and letters in the following accompanying drawings indicate similar items. Therefore, once a certain item is defined in one of the accompanying drawings, there is no need to further discuss the item in the subsequent accompanying drawings.

The embodiments of the present disclosure may be applicable to a terminal device, a computer system, a server, and other electronic devices, which may be operated together with numerous other general-purpose or special-purpose computing system environments or configurations. Well-known examples of the terminal device, the computing systems, and environment and/or configuration applicable to be used with the terminal device, the computer system, the server, and other electronic devices include but are not limited to: a personal computer system, a server computer system, a thin client, a thick client, a handheld or laptop device, a microprocessor-based system, a set-top box, programmable consumer electronics, a network personal computer, a small computer systems, a mainframe computer system, and a distributed cloud computing technology environment including any of the foregoing systems, and the like.

The terminal device, the computer system, the server, and other electronic devices may be described in general context of a computer system-executable instruction (such as a program module) executed by the computer system. Generally, the program module may include a routine, a program, a target program, a component, logic, a data structure, and the like that execute particular tasks or implement particular abstract data types. The computer system/server may be implemented in a distributed cloud computing environment. In the distributed cloud computing environment, a task is executed by a remote processing device linked through a communications network. In the distributed cloud computing environment, the program module may be located on a storage medium of a local or remote computing system including a storage device.

Application Overview

Prior data compression methods include the followings.

1. A compression method based on mask data. According to this method, mask data zeromask is set. For M-byte data, data of 0 is marked with M bits in the zeromask, and only data that is not 0 is saved. According to this method, data that is not 0 cannot be further compressed.

2. A short integer compression method. The principle of this method is that most of numerical values in a feature map have relatively small absolute values. For example, in a feature map with int8, if many numerical values are between [−15, 15], these data may be saved with only 5 bits instead of 8 bits. According to this method, typically a sign bit needs to be moved to a lowest order bit, resulting in a complicated compression process and low efficiency.

Exemplary System

FIG. 1 shows an exemplary system architecture 100 to which a data compression method or a data compression apparatus according to an embodiment of the present disclosure is applicable.

As shown in FIG. 1, the system architecture 100 may include a terminal device 101, a network 102, and a server 103. The network 102 is used as a medium for providing a communication link between the terminal device 101 and the server 103. The network 102 may include various types of connection, such as wired and wireless communication links, fiber optic cables, or the like.

A user may use the terminal device 101 to interact with the server 103 through the network 102, to receive or send a message. Various communication client applications, such as an image processing application, a video playback application, a search application, a web browser application, a shopping application, and an instant messaging tool may be installed in the terminal device 101.

The terminal device 101 may be various types of electronic devices, including but not limited to a mobile phone, a notebook computer, a digital broadcast receiver, a PDA (personal digital assistant), a PAD (tablet), a PMP (portable multimedia player), a mobile terminal such as a vehicle-mounted terminal (for example, a vehicle navigation terminal), and fixed terminals such as a digital TV and a desktop computer.

The server 103 may be a server that provides various services, for example, a background server that processes various types of data such as an image and text uploaded by the terminal device 101. The background server may process the received data in various ways, and compress the obtained data (for example, a feature map generated by a neural network and a parameter of the neural network) during the processing, to obtain compressed data.

It should be noted that the data compression method provided in this embodiment of the present disclosure may be implemented by the server 103, and may also be implemented by the terminal device 101. Correspondingly, the data compression apparatus may be disposed in the server 103, and may also be disposed in the terminal device 101.

It should be understood that quantities of the terminal device, the network, and the server shown in FIG. 1 are merely illustrative. According to implementation requirements, there may be any quantity of terminal devices, networks, and servers. When there is no need to obtain a to-be-compressed data set remotely, the foregoing system architecture may not include a network, but only include a server or a terminal device.

Exemplary Method

Figure 2:
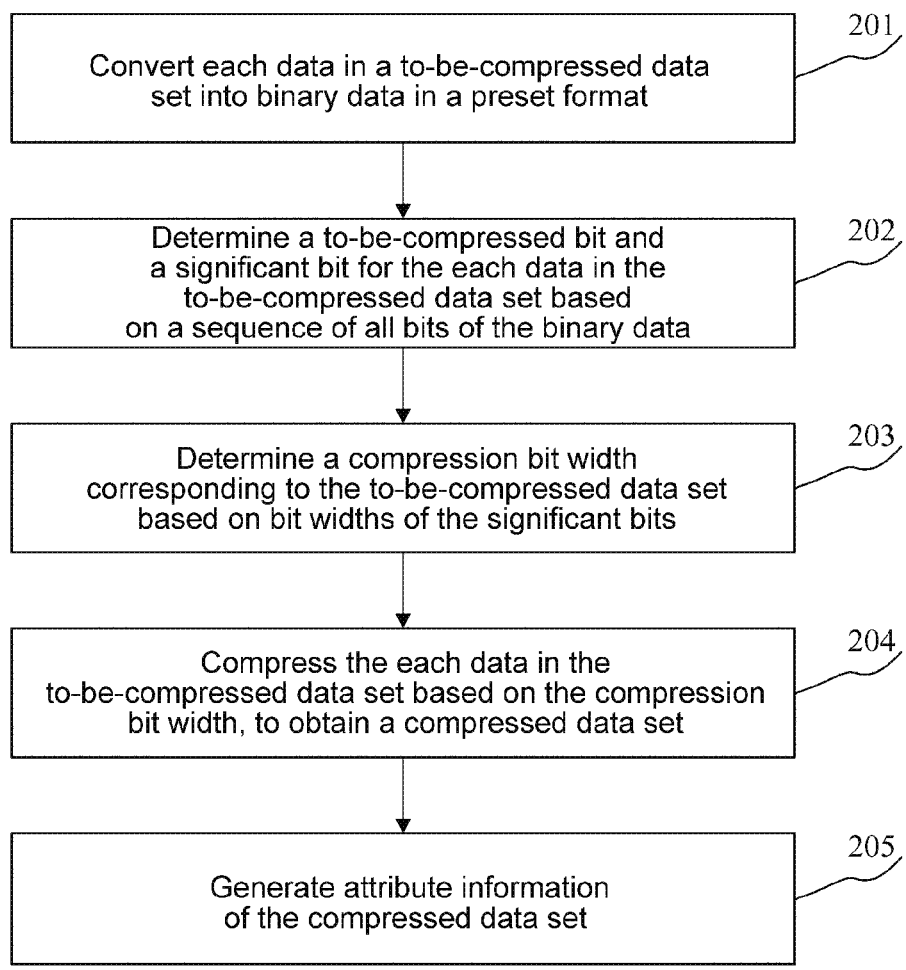
FIG. 2 is a schematic flowchart of a data compression method in accordance with an exemplary embodiment of the present disclosure.

FIG. 2 is a schematic flowchart of a data compression method in accordance with an exemplary embodiment of the present disclosure. This embodiment may be applicable to an electronic device (for example, the terminal device 101 or the server 103 shown in FIG. 1). As shown in FIG. 2, the method includes the following steps.

Step 201. Convert each data in a to-be-compressed data set into binary data in a preset format.

In this embodiment, the electronic device may convert the each data in the to-be-compressed data set into binary data in the preset format. The each data in the to-be-compressed data set may be various types of data, for example, feature data generated during operation of a neural network, or various parameters included in the neural network. The foregoing preset format may be any format, for example, may be binary data in a complement format.

Step 202. Determine a to-be-compressed bit and a significant bit for the each data in the to-be-compressed data set based on a sequence of all bits of the binary data.

In this embodiment, the electronic device may determine the to-be-compressed bit and the significant bit for the each data in the to-be-compressed data set based on the sequence of the all bits of the binary data. The significant bit is one or more bits that can represent a real value. For example, the to-be-compressed bit may indicate bits that are consecutively arranged from a highest order bit and have a same value. For example, for a decimal numeral 9, its binary data in the complement format is 00001001, where three high-order bits are all 0 so that 0 may be omitted, and 01001 at five low-order bits are reserved as the significant bit with a sign bit 0 at the highest order bit. For another example, for a decimal numeral −3, its binary data in the complement format is 11111101, where five high-order bits are all 1 so that 1 may be omitted, and 101 at three low-order bits are reserved as the significant bit with a sign bit 1 at the highest order bit.

Step 203. Determine a compression bit width corresponding to the to-be-compressed data set based on bit widths of the significant bits.

In this embodiment, the electronic device may determine the compression bit width corresponding to the to-be-compressed data set based on the bit widths of the significant bits. Typically, a maximum bit width may be determined as the compression bit width corresponding to the to-be-compressed data set from the determined bit widths of the respective significant bits. For example, the decimal numeral 9 has a significant bit of 01001, where if the bit width of the significant bit is the maximum bit width among the bit widths of the significant bits corresponding to the respective data, the compression bit width corresponding to the to-be-compressed data set is 5.

Step 204. Compress the each data in the to-be-compressed data set based on the compression bit width, to obtain a compressed data set.

In this embodiment, the electronic device may compress the each data in the to-be-compressed data set based on the compression bit width, to obtain the compressed data set. For example, if a bit width of a significant bit of a certain data is smaller than the compression bit width, several sign bits may be added before the significant bit of the data so that a new bit width of the binary data is equal to the foregoing compression bit width. For example, assuming that the compression bit width is 5, for a significant bit 101 corresponding to decimal number −3, two sign bits may be added before the highest order bit to obtain compressed data 11101.

Step 205. Generate attribute information of the compressed data set.

In this embodiment, the electronic device may generate the attribute information of the compressed data set. The attribute information is used to indicate an association relationship between the compressed data set and the to-be-compressed data set. The electronic device may decompress the compressed data set based on the attribute information, to obtain a raw data set (that is, the foregoing to-be-compressed data set).

Optionally, the attribute information may include the foregoing compression bit width. In other words, step 205 may include: generating first attribute information indicating the compression bit width. For example, a quantity of bits occupied by data recording the compression bit width may be determined based on the compression bit width, where the compression bit width may be set at the occupied bits. For example, if the compression bit width is 5, three bits are set for recording the compression bit width, that is, binary numeral 101. By setting the compression bit width as the first attribute information, when decompressing the compressed data set, a boundary of each data may be determined from the compressed data set based on the compression bit width, thereby helping to accurately obtain restored data.

According to the method provided in the foregoing embodiment of the present disclosure, the each data in the to-be-compressed data set is converted into the binary data in the preset format; the to-be-compressed bit and the significant bit are determined for the each data based on the sequence of the all bits of the binary data; the compression bit width corresponding to the to-be-compressed data set is determined based on the bit widths of the respective significant bits; the each data is compressed based on the compression bit width, to obtain the compressed data set;

and the attribute information of the compressed data set is generated. In this way, the significant bit may be determined based on the sequence of the all bits without adjusting orders of the respective bits of the binary data. In this way, a data compression process is simplified, and efficiency of data compression is improved.

In some optional implementations, the foregoing step 202 may be performed as:

for the each data in the to-be-compressed data set, based on the sequence of the all bits of the binary data corresponding to the each data, sequentially determining bits meeting a preset compression condition in the binary data corresponding to the each data as the to-be-compressed bits, and determining bits other than the to-be-compressed bit in the binary data corresponding to the each data as the significant bit. For example, from a highest order bit of the binary data, it may be sequentially determined whether the respective bits meet the compression condition. The foregoing compression condition is used to determine which bits can be removed. The compression condition may be set arbitrarily. For example, different compression conditions are set depending on whether all data in the to-be-compressed data set are non-negative numbers. For example, when all data in the to-be-compressed data set are non-negative numbers, it is determined that all bits that are the same as the sign bit and are consecutively arranged after the sign bit meet the compression condition. By setting the compression condition, which are significant bits and which are compressible bits in the binary data may be determined more flexibly, thereby improving flexibility of data compression. In this way, the data compression method is adaptable to more application scenarios.

In some optional implementations, the electronic device may determine the to-be-compressed bit and the significant bit based on the compression condition described in the following steps:

if a type of the to-be-compressed data set is a first type, sequentially comparing the respective bits of the binary data corresponding to the each data with a target bit according to a preset traversal sequence, determining a bit that is the same as the target bit as the to-be-compressed bit until a current bit becomes different from the target bit, and determining the current bit along with a bit thereafter as the significant bit; and The first type indicates that each data in the to-be-compressed data set does not need to be indicated by a sign bit. The target bit may be a highest order bit. For example, if a binary complement code of the decimal numeral 9 is 00001001, from the highest order bit, bits with a value of 0 are sequentially determined as to-be-compressed bits, until a current bit becomes 1, the current bit 1 along with the bits 001 thereafter are determined as the significant bit. When the type of the to-be-compressed data set is the first type, there is no need to use the sign bit, so that smaller storage space is occupied by the compressed data.

if the type of the to-be-compressed data set is a second type, sequentially comparing the respective bits of the binary data corresponding to the each data with the target bit according to the preset traversal sequence, determining a bit that is the same as the target bit as the to-be-compressed bit until a next bit adjacent to a current bit is different from the target bit when the current bit is the same as the target bit, and determining the current bit along with a bit thereafter as the significant bit.

The second type indicates that each of all data in the to-be-compressed data set needs to be indicated with a sign bit. The target bit may be a highest order bit. For example, if a binary complement code of the decimal numeral −3 is 11111101, from the highest order bit, bits with a value of 1 are sequentially determined as the to-be-compressed bit until a current bit is 1 and a bit after 1 is 0, and the current bit 1 and bits 01 thereafter are determined as the significant bit, that is, 101.

It should be noted that, for a decimal numeral 0, regardless of the type of the to-be-compressed data set, the significant bits thereof are 0, and a bit width of the significant bit is 1.

For example, assuming that the to-be-compressed data set includes eight data which respectively are 0, 1, −3, 0, −2, 9, 0, and −7, the type of the to-be-compressed data set is the second type, and compression forms of these data are shown in the following table.

| Number | Complement | Significant Bit | Bit Width Of Significant Bit |
|---|---|---|---|
| 0 | 0000 0000 | 0 | 1 |
| 1 | 0000 0001 | 01 | 2 |
| −3 | 1111 1101 | 101 | 3 |
| 0 | 0000 0000 | 0 | 1 |
| −2 | 1111 1110 | 10 | 2 |
| 9 | 0000 1001 | 01001 | 5 |
| 0 | 0000 0000 | 0 | 1 |
| −7 | 1111 1001 | 1001 | 4 |

According to this implementation, by setting different compression conditions for different types of to-be-compressed data sets, the different types of to-be-compressed data sets may be compressed in different ways, accordingly the each data may be compressed more flexibly. When the type of the to-be-compressed data set is the first type, the storage space occupied by the compressed data may be further reduced.

Figure 3:
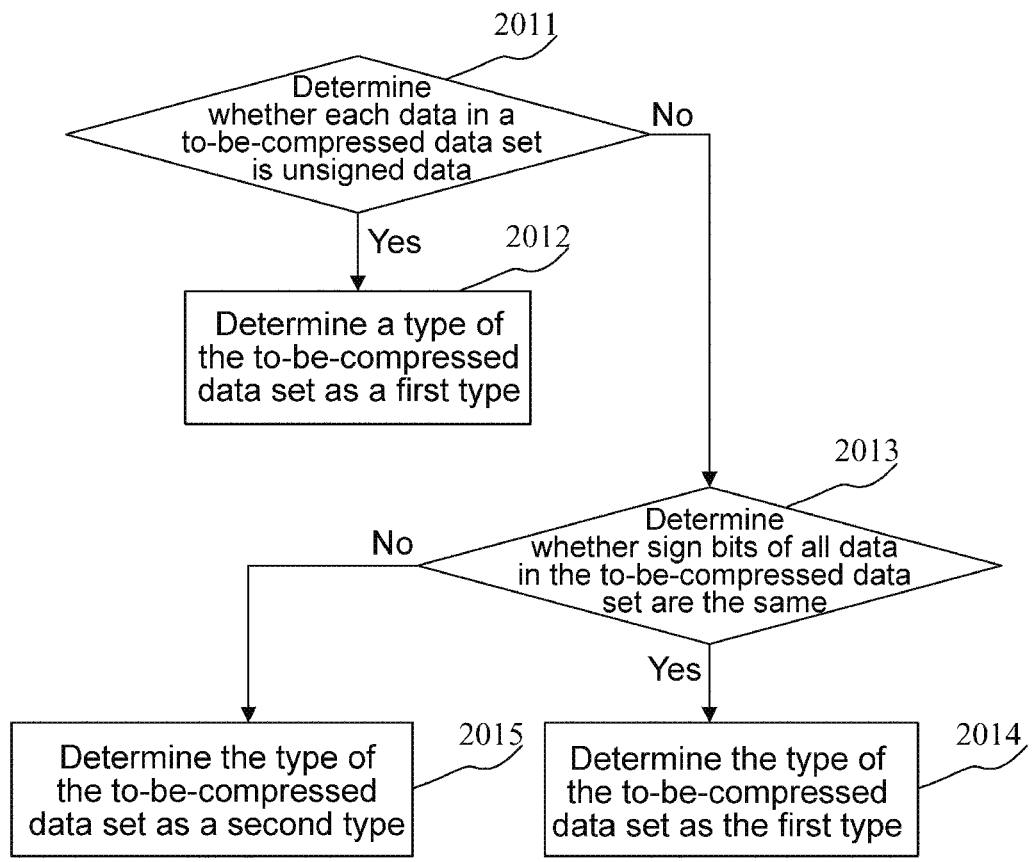
FIG. 3 is a schematic flowchart of a data compression method in accordance with another exemplary embodiment of the present disclosure.

In some optional implementations, as shown in FIG. 3, after the foregoing step 201, the electronic device may further determine the type of the to-be-compressed data set according to the following steps.

Step 2011. Determine whether all data in the to-be-compressed data set is unsigned data.

Unsigned data is data without a sign bit indicating whether the each data is positive or negative. If it is determined that the all data in the to-be-compressed data set is unsigned data, proceed to step 2012; and if not, proceed to step 2013.

Step 2012. Determine a type of the to-be-compressed data set as a first type.

To be specific, when all data in the to-be-compressed data set is unsigned data, there is no need to use the sign bit. In this case, the significant bit does not need to include the sign bit, and thus the storage space occupied by the compressed data is smaller.

Step 2013. Determine whether sign bits of the all data in the to-be-compressed data set are the same.

If all of the sign bits are the same, proceed to step 2014; and if not, proceed to step 2015.

Step 2014. Determine the type of the to-be-compressed data set as the first type.

In this case, although the each data in the to-be-compressed data set is signed data, because the sign bits of all data are the same, the significant bit may not include a sign bit, and thus the storage space occupied by the compressed data is smaller. For example, when all data in the to-be-compressed data set are positive numbers, the significant bit may not include a sign bit 0. For example, compressed data corresponding to the decimal numeral 9 is 1001.

Step 2015. Determine the type of the to-be-compressed data set as a second type.

In this case, a sign bit needs to be reserved for the each data in the to-be-compressed data set. For example, compressed data corresponding to the decimal numeral 9 is 01001.

According to this implementation, by determining whether the each data in the to-be-compressed data set is unsigned data, the to-be-compressed data set may be classified depending on a sign for the data, thereby helping to perform data compression more flexibly and further reducing the storage space occupied by the compressed data.

In some optional implementations, the electronic device may further generate second attribute information indicating the type of the to-be-compressed data set. In other words, the second attribute information is used to indicate the type of the to-be-compressed data set. For example, the first type may be indicated by digit 0, that is, the significant bit may not include a sign bit; and the second type may be indicated by digit 1, that is, the significant bit needs to include a sign bit. Regarding the second attribute information provided in this implementation, it may be determined based on the second attribute information whether the compressed data includes a sign bit, while decompressing the compressed data set, thereby helping to restore the compressed data to raw data more accurately.

In some optional implementations, if the type of the to-be-compressed data set is the first type and the each data therein is signed data, and a sign bit corresponding to the first type is not predefined, fifth attribute information indicating the sign bit corresponding to the first type is generated. For example, if the sign bit corresponding to the first type is not predefined, that is, the sign bit corresponding to the first type may be 0 or 1, binary data 00000001 and 11111101 may each be compressed as 01 when the compression bit width is 2. To distinguish between positive and negative data, the fifth attribute information may be further generated (for example, digit 0 is used to indicate that the sign bit corresponding to the first type is 0, and digit 1 is used to indicate that the sign bit corresponding to the first type is 1).

If the to-be-compressed data set has the first type and signed data, and the sign bit corresponding to the first type is predefined, the fifth attribute information is omitted. For example, if it is predefined that the sign bit is compressed when all data in the to-be-compressed data set are signed data and are non-negative numbers. In this case, the fifth attribute information may be omitted, and it is default that the compressed sign bit is 0. In this way, content included in the attribute information may be further reduced and a compression ratio for the each data is increased.

Figure 4:
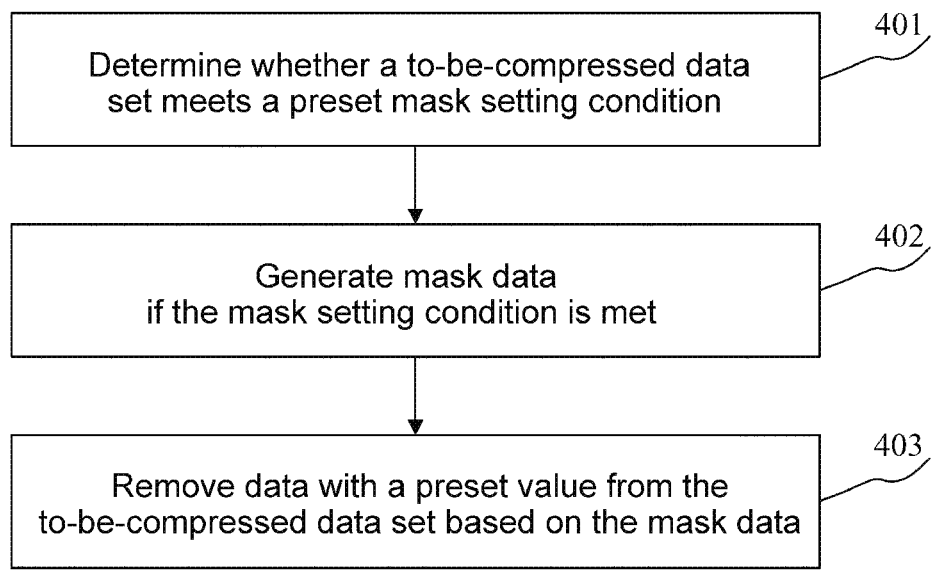
FIG. 4 is a schematic flowchart of a data compression method in accordance with still another exemplary embodiment of the present disclosure.

Further, referring to FIG. 4, FIG. 4 is schematic flowchart of a data compression method in accordance with still another embodiment. As shown in FIG. 4, the data compression method may further include the following steps.

Step 401. Determine whether the to-be-compressed data set meets a preset mask setting condition.

The mask setting condition is used to determine which data in the to-be-compressed data set is removed.

Step 402. Generate mask data if the mask setting condition is met.

The mask data is used to mark data with a preset value in the to-be-compressed data set. For example, the data with a preset value may be 0. Each bit in the mask data corresponds to a to-be-compressed data, and is used to indicate whether the corresponding data is 0. For example, the mask data is 11111100, where two 0s indicate that two of the to-be-compressed data are 0.

Step 403. Remove the data with the preset value from the to-be-compressed data set based on the mask data.

Return to the foregoing example, data corresponding to two 0s in the mask data may be removed from the to-be-compressed data set.

It should be noted that when the to-be-compressed data set does not meet the mask setting condition, the data with a preset value in the to-be-compressed data set needs to be reserved and compressed. For example, a decimal data 0 has a binary form of 00000000, where its significant bit is 0 and a bit width of the significant bit is 1.

According to the method described in the embodiments corresponding to FIG. 4, the data with a preset value in the to-be-compressed data set may be removed through setting the mask data, so that the each data may be compressed, and the storage space occupied by the compressed data may be reduced.

In some optional implementations, in the foregoing step 401, the electronic device may determine whether the to-be-compressed data set meets the preset mask setting condition according to at least one of the following two manners.

Manner I: Determine a quantity of the data with the preset value in the to-be-compressed data set, and determine whether the to-be-compressed data set meets the preset mask setting condition based on the quantity and a preset quantity.

The preset value may be any specified value. Generally, the preset value may be 0. In other words, the quantity of data with a value of 0 in the to-be-compressed data is determined.

The preset quantity may be predetermined based on a total quantity of bytes of the each data included in the to-be-compressed data set. For example, the preset quantity may be M/8, where M indicates the total quantity of the bytes of the each data included in the to-be-compressed data set. The mask setting condition is that the quantity of data 0 is greater than M/8. Assuming M=64, 8-byte mask data is required. When the quantity of data 0 is greater than 8, the mask setting condition is met, and a mask may be set at this time. If the quantity of data 0 is smaller than or equal to 8, storage space saved after the each data 0 is removed is less than or equal to storage space occupied by the mask data. In this case, there is no need to set the mask data.

Manner II: Determine whether the preset mask setting condition is met based on a pre-generated instruction indicating whether to generate the mask data. The instruction is generated by pre-estimating the data with the preset value for the to-be-compressed data before the to-be-compressed data set is obtained.

For example, when the to-be-compressed data set includes data in a feature map generated by the neural network, if the to-be-compressed data is generated through an activation function such as ReLU or LeakyReLU, the instruction used for instructing to generate the mask data may be generated before the to-be-compressed data is generated (for example, during compilation). If the instruction is detected by the electronic device, it is determined that the mask setting condition is met. Specifically, through the activation function such as ReLU, all negative numbers are changed to 0. In this case, the quantity of 0s is necessarily great. If the to-be-compressed data set is obtained through such activation function, mask data needs to be set. For another example, regarding the activation function LeakyReLU, the negative number is not directly changed to 0, but is multiplied by a decimal in an interval [0, 1], and then several negative numbers may also be changed to 0, where whether to set the mask data may be determined depending on the quantity of 0s.

According to two mask setting conditions provided in this implementation, based on the quantity of the data with the preset value in the to-be-compressed data set or pre-estimating of a quantity of data with a preset value before the to-be-compressed data set is generated, it may be flexibly determined whether the mask data needs to be set, thereby helping to flexibly compress the each data based on an actual situation of the to-be-compressed data set.

In some optional implementations, in the foregoing manner I, the electronic device may further generate third attribute information indicating whether the compressed data set has corresponding mask data. In other words, the third attribute information is used to indicate whether the compressed data set has corresponding mask data. For example, the digit 1 may be used to indicate that the mask data is used, and the digit 0 indicates that the mask data is not used. It should be noted that if it is determined based on the instruction in the foregoing manner II whether the mask data needs to be generated, because the instruction is generated before the to-be-compressed data set is generated, for decompression, it may be determined based on the instruction whether the mask data is used, without generating the third attribute information.

Regarding the third attribute information provided in this implementation, when decompressing the compressed data set, whether the compressed data includes the mask data may be determined based on the third attribute information. In this way, when the mask data is used, the mask data may be accurately extracted from the compressed data for decompression, thereby helping to restore the compressed data to raw data more accurately.

In some optional implementations, after step 402, the electronic device may further determine fourth attribute information of the to-be-compressed data based on the mask data.

Specifically, the mask data may be determined as the fourth attribute information, so as to restore the data with a preset value based on the fourth attribute information during decompression of the compressed data, thereby helping to restore the compressed data to raw data more accurately.

In some optional implementations, after the foregoing step 205 in the embodiment corresponding to FIG. 2, the electronic device may further generate a compressed data packet based on the compressed data set and the attribute information. The compressed data set may be stored or transmitted by the compressed data packet. When the compressed data set needs to be decompressed, the attribute information may be extracted from the compressed data packet, and the compressed data is decompressed based on the attribute information.

For example, forms of the compressed data packet may be as shown in the following table.

| Name | First Attribute Information | Second Attribute Information | Third Attribute Information | Fourth Attribute Information | Compressed Data Set |
|---|---|---|---|---|---|
| Usage | Compression Bit Width | Presence of Sign Bit or Not | Presence of Mask Data or Not | Mask Data (Optional) | |
| Quantity Of Occupied Bits | 3 | 1 | 1 | 16 (Adjustable Based On Practice) | 1 To 8 Varied (For Each Data) |

The compressed data packet generated in this implementation may be convenient for storage or transmission of the compressed data. For decompressed of the compressed data, the each data may be accurately restored based on the attribute information. In this way, decompression accuracy may be ensured while data compression performance is improved.

Exemplary Apparatus

Figure 5:
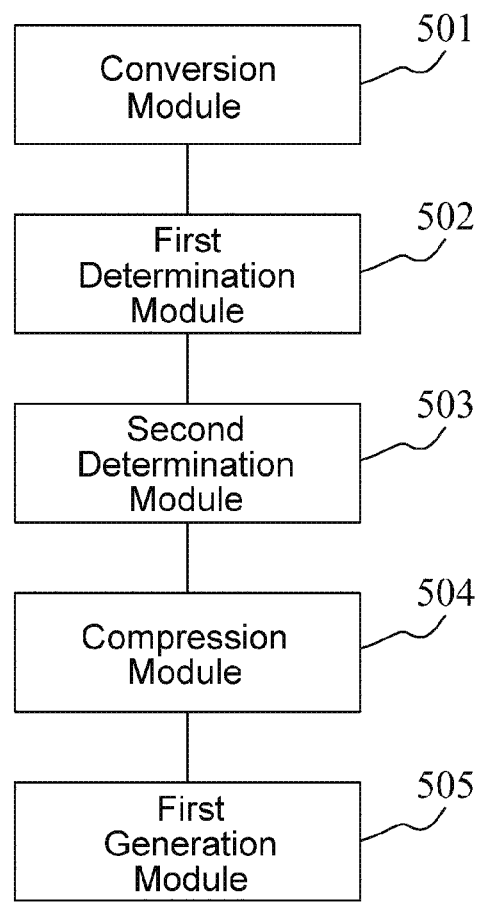
FIG. 5 is a schematic block diagram illustrating a configuration of a data compression apparatus in accordance with an exemplary embodiment of the present disclosure.

FIG. 5 is a schematic block diagram illustrating a configuration of a data compression apparatus in accordance with an exemplary embodiment of the present disclosure. This embodiment may be applied to an electronic device. As shown in FIG. 5, the data compression apparatus includes: a conversion module 501, configured to convert each data in a to-be-compressed data set into binary data in a preset format; a first determination module 502, configured to determine a to-be-compressed bit and a significant bit for the each data in the to-be-compressed data set based on a sequence of all bits of the binary data; a second determination module 503, configured to determine a compression bit width corresponding to the to-be-compressed data set based on bit widths of the significant bits; a compression module 504, configured to compress the each data in the to-be-compressed data set based on the compression bit width, to obtain a compressed data set; and a first generation module 505, configured to generate attribute information of the compressed data set, where the attribute information is used to indicate an association relationship between the compressed data set and the to-be-compressed data set.

In this embodiment, the conversion module 501 may convert the each data in the to-be-compressed data set into binary data in the preset format. The each data in the to-be-compressed data set may be various types of data, for example, feature data generated during operation of a neural network, or various parameters included in the neural network. The foregoing preset format may be any format, for example, may be binary data in a complement format.

In this embodiment, the first determination module 502 may determine the to-be-compressed bit and the significant bit for the each data in the to-be-compressed data set based on the sequence of the all bits of the binary data. The significant bit is one or more bits that can represent a real value. For example, the to-be-compressed bit may indicate bits that are consecutively arranged from a highest order bit and have a same digit. For example, for a decimal numeral 9, its binary data in the complement format is 00001001, where three high-order bits are all 0 so that 0 may be omitted, and 01001 at five low-order bits are reserved as the significant bit with a sign bit 0 at the highest order bit. For another example, for a decimal numeral −3, its binary data in the complement format is 11111101, where five high-order bits are all 1 so that 1 may be omitted, and 101 at three low-order bits are reserved as the significant bit with a sign bit 1 at the highest order bit.

In this embodiment, the second determination module 503 may determine the compression bit width corresponding to the to-be-compressed data set based on the bit widths of the significant bits. Typically, a maximum bit width may be determined as the compression bit width corresponding to the to-be-compressed data set from the determined bit widths of the respective significant bits. For example, the decimal numeral 9 has a significant bit of 01001, where if the bit width of the significant bit is the maximum bit width among the bit widths of the significant bits corresponding to the respective data, the compression bit width corresponding to the to-be-compressed data set is 5.

In this embodiment, the compression module 504 may compress the each data in the to-be-compressed data set based on the compression bit width, to obtain the compressed data set. For example, if a bit width of a significant bit of a certain data is smaller than the compression bit width, several sign bits may be added before the significant bit of the data so that a new bit width of the binary data is equal to the foregoing compression bit width. For example, assuming that the compression bit width is 5, for a significant bit 101 corresponding to decimal number −3, two sign bits may be added before the highest order bit to obtain compressed data 11101.

In this embodiment, the first generation module 505 may generate the attribute information of the compressed data set. The attribute information is used to indicate an association relationship between the compressed data set and the to-be-compressed data set. The first generation module 505 may decompress the compressed data set based on the attribute information, to obtain a raw data set (that is, the foregoing to-be-compressed data set).

Figure 6:
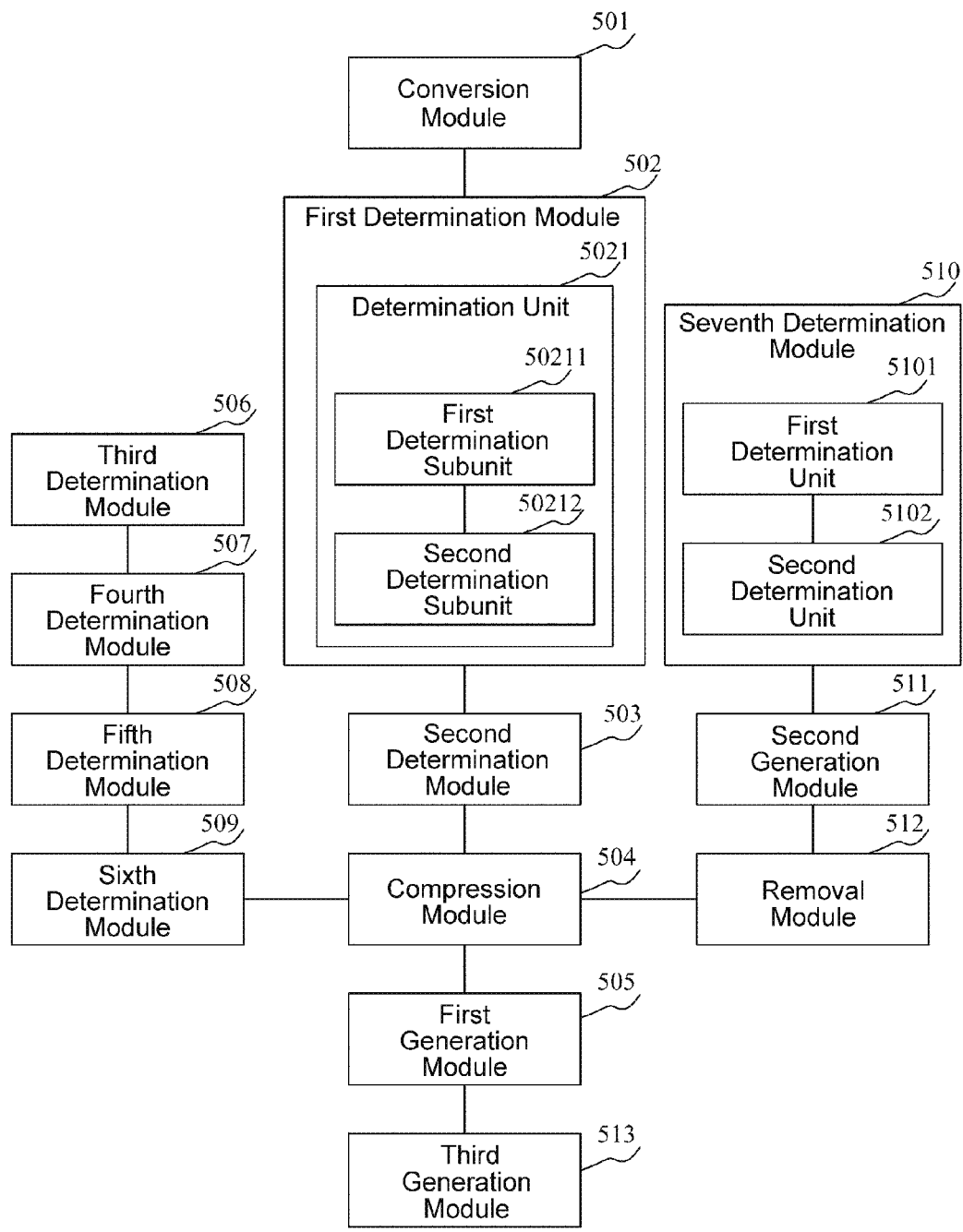
FIG. 6 is a schematic block diagram illustrating a configuration of a data compression apparatus in accordance with another exemplary embodiment of the present disclosure.

Referring to FIG. 6, FIG. 6 is a schematic block diagram illustrating a configuration of a data compression apparatus in accordance with another exemplary embodiment of the present disclosure.

In some optional implementations, the first determination module 502 may include a determination unit 5021 that is configured to sequentially determine, for the each data in the to-be-compressed data set and based on the sequence of the all bits of the binary data corresponding to the each data, bits meeting a preset compression condition in the binary data corresponding to the each data as the to-be-compressed bit, and determine bits other than the to-be-compressed bits in the binary data corresponding to the each data as the significant bit.

In some optional implementations, the first generation module 505 may be further configured to generate first attribute information indicating the compression bit width.

In some optional implementations, the determination unit 5021 may include: a first determination subunit 50211, configured to sequentially compare the respective bits of the binary data corresponding to the each data with a target bit according to a preset traversal sequence if a type of the to-be-compressed data set is a first type, determine a bit that is the same as the target bit as the to-be-compressed bit until a current bit becomes different from the target bit, and determine the current bit along with a bit thereafter as the significant bit; and a second determination subunit 50212, configured to sequentially compare the respective bits of the binary data corresponding to the each data with the target bit according to the preset traversal sequence if the type of the to-be-compressed data set is a second type, determine a bit that is the same as the target bit as the to-be-compressed bit until a next bit adjacent to a current bit is different from the target bit when the current bit is the same as the target bit, and determine the current bit along with a bit thereafter as the significant bit.

In some optional implementations, the apparatus may further include: a third determination module 506, configured to determine whether the all data in the to-be-compressed data set is unsigned data; a fourth determination module 507, configured to determine the type of the to-be-compressed data set as the first type if the each data in the to-be-compressed data set is unsigned data; a fifth determination module 508, configured to determine the type of the to-be-compressed data set as the second type if all data in the to-be-compressed data set is signed data with different sign bits; and a sixth determination module 509, configured to determine the type of the to-be-compressed data set as the first type if all data in the to-be-compressed data set is signed data with the same sign bits.

In some optional implementations, the first generation module 505 may be further configured to generate second attribute information indicating the type of the to-be-compressed data set.

In some optional implementations, if the type of the to-be-compressed data set is the first type and the each data is signed data, and a sign bit corresponding to the first type is not predefined, fifth attribute information indicating the sign bit corresponding to the first type is generated; and if the type of the to-be-compressed data set is the first type and the each data is signed data, and the sign bit corresponding to the first type is predefined, the fifth attribute information is omitted.

In some optional implementations, the apparatus may further include: a seventh determination module 510, configured to determine whether the to-be-compressed data set meets a preset mask setting condition; a second generation module 511, configured to generate mask data if the mask setting condition is met, where the mask data is used to mark data with a preset value in the to-be-compressed data set; and a removal module 512, configured to remove the data with the preset value from the to-be-compressed data set based on the mask data.

In some optional implementations, the seventh determination module 510 may include: a first determination unit 5101, configured to determine a quantity of the data with the preset value in the to-be-compressed data set, and determine whether the to-be-compressed data set meets the preset mask setting condition based on the quantity and a preset quantity; and a second determination unit 5102, configured to determine whether the preset mask setting condition is met based on a pre-generated instruction indicating whether to generate the mask data, where the instruction is generated by pre-estimating the data with the preset value for the to-be-compressed data before the to-be-compressed data set is obtained.

In some optional implementations, the first generation module 505 may be further configured to generate third attribute information indicating whether the compressed data set has corresponding mask data.

In some optional implementations, the first generation module 505 may be further configured to determine fourth attribute information of the to-be-compressed data based on the mask data.

In some optional implementations, the apparatus may further include a third generation module 513 that is configured to generate a compressed data packet based on the compressed data set and the attribute information.

According to the data compression apparatus provided in the foregoing embodiment of the present disclosure, the each data in the to-be-compressed data set is converted into the binary data in the preset format; the to-be-compressed bit and the significant bit are determined for the each data based on the sequence of the all bits of the binary data; the compression bit width corresponding to the to-be-compressed data set is determined based on the bit widths of each significant bits; the each data is compressed based on the compression bit width, to obtain the compressed data set; and the attribute information of the compressed data set is generated.

In this way, the significant bit may be determined based on the sequence of the all bits without adjusting orders of the respective bits of the binary data. In this way, a data compression process is simplified, and efficiency of data compression is improved.

Exemplary Electronic Device

An electronic device according to an embodiment of the present disclosure is described below with reference to FIG. 7. The electronic device may be any one or two of a terminal device 101 and a server 103, or a stand-alone device separated from the terminal device 101 and the server 103 shown in FIG. 1. The stand-alone device may communicate with the terminal device 101 and the server 103, to receive obtained input signals therefrom.

Figure 7:
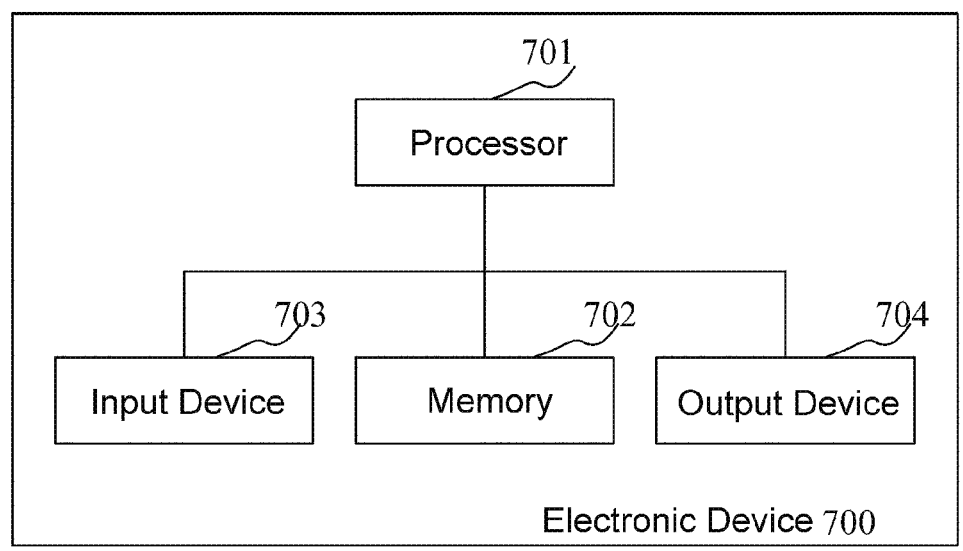
FIG. 7 is a block diagram illustrating a configuration of an electronic device in accordance with an exemplary embodiment of the present disclosure.

FIG. 7 is a block diagram illustrating an electronic device according to an embodiment of the present disclosure.

As shown in FIG. 7, an electronic device 700 includes one or more processors 701 and a memory 702.

The processor 701 may be a central processing unit (CPU) or another form of processing unit having a data processing capability and/or an instruction execution capability, and may control another component in the electronic device 700 to perform a desired function.

The memory 702 may include one or more computer program products. The computer program product may include various forms of computer-readable storage media, such as a volatile memory and/or a non-volatile memory. The volatile memory may include, for example, a random access memory (RAM) and/or a cache. The nonvolatile memory may include, for example, a read-only memory (ROM), a hard disk, and a flash memory. One or more computer program instructions may be stored on the computer-readable storage medium. The program instruction may be executed by the processor 701, to implement the data compression method according to the foregoing various embodiments of the present disclosure and/or other desired functions. Various contents such as a to-be-compressed data set may also be stored in the computer-readable storage medium.

In an example, the electronic device 700 may further include an input device 703 and an output device 704. These components are connected with each other through a bus system and/or another form of connection mechanism (not shown).

For example, when the electronic device is the terminal device 101 or the server 103, the input device 703 may be a device such as a mouse or a keyboard for inputting the to-be-compressed data set. When the electronic device is a stand-alone device, the input device 703 may be a communication network connector, and is configured to receive the to-be-compressed data set from the terminal device 101 and the server 103.

The output device 704 may output various information to the outside, including a compressed data set. The output device 704 may include, for example, a display, a loudspeaker, a printer, a communication network, and a remote output device connected by the communication network.

Certainly, for simplicity, FIG. 7 shows only some of components in the electronic device 700 that are related to the present disclosure, and components such as a bus and an input/output interface are omitted. In addition, according to specific application situations, the electronic device 700 may further include any other appropriate components.

Exemplary Computer Program Product and Computer-Readable Storage Medium

In addition to the foregoing method and device, the embodiments of the present disclosure may further relate to a computer program product, which includes a computer program instruction. When the computer program instruction is executed by a processor, the processor is enabled to perform the steps, of the data compression method according to the embodiments of the present disclosure, that are described in the "exemplary method" part of this specification.

The computer program product may be program code, written with one or any combination of a plurality of programming languages, that is configured to perform the operations in the embodiments of the present disclosure. The programming languages include an object-oriented programming language such as Java or C++, and further include a conventional procedural programming language such as a "C" language or a similar programming language. The program code may be entirely or partially executed on a user computing device, executed as an independent software package, partially executed on the user computing device and partially executed on a remote computing device, or entirely executed on the remote computing device or a server.

In addition, the embodiments of the present disclosure may further relate to a computer-readable storage medium, which stores a computer program instruction. When the computer program instruction is executed by the processor, the processor is enabled to perform the steps, of the data compression method according to the embodiments of the present disclosure, that are described in the "exemplary method" part of this specification.

The computer-readable storage medium may be one readable medium or any combination of a plurality of readable media. The readable medium may be a readable signal medium or a readable storage medium. The readable storage medium may include, for example, but is not limited to electricity, magnetism, light, electromagnetism, infrared ray, or a semiconductor system, apparatus or device, or any combination of the above. More specific examples (a non-exhaustive list) of the readable storage medium include: an electrical connection with one or more conducting wires, a portable disk, a hard disk, a random access memory (RAM), a read-only memory (ROM), an erasable programmable read-only memory (EPROM or flash memory) or a flash memory, an optical fiber, a portable compact disk read-only memory (CD-ROM), an optical storage device, a magnetic storage device, or any suitable combination of the above.

Basic principles of the present disclosure are described above in combination with the specific embodiments. However, it should be pointed out that the advantages, superiorities, and effects mentioned in the present disclosure are merely illustrative but are not for limitation, and it cannot be considered that these advantages, superiorities, and effects are necessary for each embodiment of the present disclosure. In addition, specific details of the above disclosure are merely for examples and for ease of understanding, rather than limitations. The foregoing details do not limit that the present disclosure must be implemented by using the foregoing specific details.

The various embodiments in this specification are all described in a progressive way, and each embodiment focuses on a difference from other embodiments. For same or similar parts among the various embodiments, reference may be made to each other. The system embodiments basically correspond to the method embodiments, and thus are relatively simply described. For related parts, reference may be made to a part of the descriptions of the method embodiments.

The block diagrams of the equipment, the apparatus, the device, and the system involved in the present disclosure are merely exemplary examples and are not intended to require or imply that the equipment, the apparatus, the device, and the system must be connected, arranged, and configured in the manners shown in the block diagrams. It is recognized by a person skilled in the art that, the equipment, the apparatus, the device, and the system may be connected, arranged, and configured in an arbitrary manner. Terms such as "include", "contain", and "have" are open terms, refer to "including but not limited to", and may be used interchangeably with "including but not limited to". The terms "or" and "and" used herein refer to the term "and/or", and may be used interchangeably with "and/of", unless the context clearly indicates otherwise. The term "such as" used herein refers to the phrase "such as but not limited to", and may be used interchangeably with "such as but not limited to".

The method and the apparatus in the present disclosure may be implemented in many ways. For example, the method and the apparatus in the present disclosure may be implemented by software, hardware, firmware, or any combination of the software, the hardware, and the firmware. The foregoing sequence of the steps of the method is for illustration only, and the steps of the method in the present disclosure are not limited to the sequence specifically described above, unless otherwise specifically stated in any other manner. In addition, in some embodiments, the present disclosure may also be implemented as programs recorded in a recording medium. These programs include machine-readable instructions for implementing the method according to the present disclosure. Therefore, the present disclosure further relates to a recording medium storing a program for implementing the method according to the present disclosure.

It should be further pointed out that, various components or various steps in the apparatus, the device, and the method of the present disclosure may be disassembled and/or recombined. These disassembled and/or recombined components or steps shall be regarded as equivalent solutions of the present disclosure.

The foregoing description about the disclosed aspects is provided, so that the present disclosure can be complete or carried out by any person skilled in the art. Various modifications to these aspects are very obvious to a person skilled in the art. Moreover, general principles defined herein may be applicable to other aspects without departing from the scope of the present disclosure. Therefore, the present disclosure is not intended to be limited to the aspect illustrated herein, but to the widest scope consistent with the principles and novel features disclosed herein.

The foregoing description has been given for illustration and description. In addition, this description is not intended to limit the embodiments of the present disclosure to be in forms disclosed herein. Although a plurality of exemplary aspects and embodiments have been discussed above, a person skilled in the art may recognize certain variations, modifications, changes, additions, and sub-combinations thereof.

What is claimed is:

1. A data compression method, including:
    converting each data in a to-be-compressed data set into binary data in a preset format;
    determining a to-be-compressed bit and a significant bit for the each data in the to-be-compressed data set based on a sequence of all bits of the binary data;
    determining a compression bit width corresponding to the to-be-compressed data set based on bit widths of the significant bits;
    compressing the each data in the to-be-compressed data set based on the compression bit width, to obtain a compressed data set; and
    generating attribute information of the compressed data set, wherein the attribute information is used to indicate an association relationship between the compressed data set and the to-be-compressed data set.

2. The method according to claim 1, wherein the determining the to-be-compressed bit and the significant bit for the each data in the to-be-compressed data set based on the sequence of the all bits of the binary data includes:
    for the each data in the to-be-compressed data set, based on the sequence of the all bits of the binary data corresponding to the each data, sequentially determining bits meeting a preset compression condition in the binary data corresponding to the each data as the to-be-compressed bit, and determining bits other than the to-be-compressed bit in the binary data corresponding to the each data as the significant bit.

3. The method according to claim 2, wherein the based on the sequence of the all bits of the binary data corresponding to the each data, sequentially the determining bits meeting the preset compression condition in the binary data corresponding to the each data as the to-be-compressed bit, and the determining bits other than the to-be-compressed bits in the binary data corresponding to the each data as the significant bits includes:
    if a type of the to-be-compressed data set is a first type, sequentially comparing the respective bits of the binary data corresponding to the each data with a target bit according to a preset traversal sequence, determining a bit that is the same as the target bit as the to-be-compressed bit until a current bit becomes different from the target bit, and determining the current bit along with a bit thereafter as the significant bit; and
    if the type of the to-be-compressed data set is a second type, sequentially comparing the respective bits of the binary data corresponding to the each data with the target bit according to the preset traversal sequence, determining a bit that is the same as the target bit as the to-be-compressed bit until a next bit adjacent to a current bit is different from the target bit when the current bit is the same as the target bit, and determining the current bit along with a bit thereafter as the significant bit.

4. The method according to claim 3, wherein after the converting each data in the to-be-compressed data set into binary data in the preset format, the method further includes:
    determining whether the each data in the to-be-compressed data set is unsigned data;
    determining the type of the to-be-compressed data set as the first type if the each data in the to-be-compressed data set is unsigned data;
    determining the type of the to-be-compressed data set as the second type if all data in the to-be-compressed data set is signed data with different sign bits; and
    determining the type of the to-be-compressed data set as the first type if the all data in the to-be-compressed data set is signed data with the same sign bits.

5. The method according to claim 1, wherein the generating the attribute information of the compressed data set includes:
    generating first attribute information indicating the compression bit width.

6. The method according to claim 1, wherein the method further includes:

determining whether the to-be-compressed data set meets a preset mask setting condition;

generating mask data if the mask setting condition is met, wherein the mask data is used to mark data with a preset value in the to-be-compressed data set; and removing the data with the preset value from the to-be-compressed data set based on the mask data.

7. The method according to claim 6, wherein the determining whether the to-be-compressed data set meets the preset mask setting condition includes:

determining a quantity of the data with the preset value in the to-be-compressed data set, and determining whether the to-be-compressed data set meets the preset mask setting condition based on the quantity and a preset quantity; and/or determining whether the preset mask setting condition is met based on a pre-generated instruction indicating whether to generate the mask data, wherein the instruction is generated by pre-estimating the data with the preset value for the to-be-compressed data set before the to-be-compressed data set is obtained.

8. A computer-readable non-transitory storage medium, in which a computer program is stored, wherein the computer program, when executed by a computer, is used to implement a data compression method including:

converting each data in a to-be-compressed data set into binary data in a preset format;

determining a to-be-compressed bit and a significant bit for the each data in the to-be-compressed data set based on a sequence of all bits of the binary data;

determining a compression bit width corresponding to the to-be-compressed data set based on bit widths of the significant bits;

compressing the each data in the to-be-compressed data set based on the compression bit width, to obtain a compressed data set; and generating attribute information of the compressed data set, wherein the attribute information is used to indicate an association relationship between the compressed data set and the to-be-compressed data set.

9. The computer-readable non-transitory storage medium according to claim 8, wherein the determining the to-be-compressed bit and the significant bit for the each data in the to-be-compressed data set based on the sequence of the all bits of the binary data includes:

for the each data in the to-be-compressed data set, based on the sequence of the all bits of the binary data corresponding to the each data, sequentially determining bits meeting a preset compression condition in the binary data corresponding to the each data as the to-be-compressed bit, and determining bits other than the to-be-compressed bit in the binary data corresponding to the each data as the significant bit.

10. The computer-readable non-transitory storage medium according to claim 9, wherein the based on the sequence of the all bits of the binary data corresponding to the each data, sequentially the determining bits meeting the preset compression condition in the binary data corresponding to the each data as the to-be-compressed bit, and the determining bits other than the to-be-compressed bits in the binary data corresponding to the each data as the significant bits includes:

if a type of the to-be-compressed data set is a first type, sequentially comparing the respective bits of the binary data corresponding to the each data with a target bit according to a preset traversal sequence, determining a bit that is the same as the target bit as the to-be-compressed bit until a current bit becomes different from the target bit, and determining the current bit along with a bit thereafter as the significant bit; and if the type of the to-be-compressed data set is a second type, sequentially comparing the respective bits of the binary data corresponding to the each data with the target bit according to the preset traversal sequence, determining a bit that is the same as the target bit as the to-be-compressed bit until a next bit adjacent to a current bit is different from the target bit when the current bit is the same as the target bit, and determining the current bit along with a bit thereafter as the significant bit.

11. The computer-readable non-transitory storage medium according to claim 10, wherein after the converting each data in the to-be-compressed data set into binary data in the preset format, the computer-readable storage medium further includes:

determining whether the each data in the to-be-compressed data set is unsigned data;

determining the type of the to-be-compressed data set as the first type if the each data in the to-be-compressed data set is unsigned data;

determining the type of the to-be-compressed data set as the second type if all data in the to-be-compressed data set is signed data with different sign bits; and determining the type of the to-be-compressed data set as the first type if the all data in the to-be-compressed data set is signed data with the same sign bits.

12. The computer-readable non-transitory storage medium according to claim 8, wherein the generating the attribute information of the compressed data set includes:

generating first attribute information indicating the compression bit width.

13. The computer-readable non-transitory storage medium according to claim 8, wherein the method further includes:

determining whether the to-be-compressed data set meets a preset mask setting condition;

generating mask data if the mask setting condition is met, wherein the mask data is used to mark data with a preset value in the to-be-compressed data set; and removing the data with the preset value from the to-be-compressed data set based on the mask data.

14. The computer-readable non-transitory storage medium according to claim 13, wherein the determining whether the to-be-compressed data set meets the preset mask setting condition includes:

determining a quantity of the data with the preset value in the to-be-compressed data set, and determining whether the to-be-compressed data set meets the preset mask setting condition based on the quantity and a preset quantity; and/or determining whether the preset mask setting condition is met based on a pre-generated instruction indicating whether to generate the mask data, wherein the instruction is generated by pre-estimating the data with the preset value for the to-be-compressed data set before the to-be-compressed data set is obtained.

15. An electronic device, including:

a processor; and a memory configured to store a processor-executable instruction, wherein the processor is configured to read the instruction from the memory, and execute the instruction to implement a data compression method including:

converting each data in a to-be-compressed data set into binary data in a preset format;
determining a to-be-compressed bit and a significant bit for the each data in the to-be-compressed data set based on a sequence of all bits of the binary data;
determining a compression bit width corresponding to the to-be-compressed data set based on bit widths of the significant bits;
compressing the each data in the to-be-compressed data set based on the compression bit width, to obtain a compressed data set; and
generating attribute information of the compressed data set, wherein the attribute information is used to indicate an association relationship between the compressed data set and the to-be-compressed data set.

16. The electronic device according to claim 15, wherein the determining the to-be-compressed bit and the significant bit for the each data in the to-be-compressed data set based on the sequence of the all bits of the binary data includes:
for the each data in the to-be-compressed data set, based on the sequence of the all bits of the binary data corresponding to the each data, sequentially determining bits meeting a preset compression condition in the binary data corresponding to the each data as the to-be-compressed bit, and determining bits other than the to-be-compressed bit in the binary data corresponding to the each data as the significant bit.

17. The electronic device according to claim 16, wherein the based on the sequence of the all bits of the binary data corresponding to the each data, sequentially the determining bits meeting the preset compression condition in the binary data corresponding to the each data as the to-be-compressed bit, and the determining bits other than the to-be-compressed bits in the binary data corresponding to the each data as the significant bits includes:
if a type of the to-be-compressed data set is a first type, sequentially comparing the respective bits of the binary data corresponding to the each data with a target bit according to a preset traversal sequence, determining a bit that is the same as the target bit as the to-be-compressed bit until a current bit becomes different from the target bit, and determining the current bit along with a bit thereafter as the significant bit; and
if the type of the to-be-compressed data set is a second type, sequentially comparing the respective bits of the binary data corresponding to the each data with the target bit according to the preset traversal sequence, determining a bit that is the same as the target bit as the to-be-compressed bit until a next bit adjacent to a current bit is different from the target bit when the current bit is the same as the target bit, and determining the current bit along with a bit thereafter as the significant bit.

18. The electronic device according to claim 17, wherein after the converting each data in the to-be-compressed data set into binary data in the preset format, the electronic device further includes:
determining whether the each data in the to-be-compressed data set is unsigned data;
determining the type of the to-be-compressed data set as the first type if the each data in the to-be-compressed data set is unsigned data;
determining the type of the to-be-compressed data set as the second type if all data in the to-be-compressed data set is signed data with different sign bits; and
determining the type of the to-be-compressed data set as the first type if the all data in the to-be-compressed data set is signed data with the same sign bits.

19. The electronic device according to claim 15, wherein the method further includes:
determining whether the to-be-compressed data set meets a preset mask setting condition;
generating mask data if the mask setting condition is met, wherein the mask data is used to mark data with a preset value in the to-be-compressed data set; and
removing the data with the preset value from the to-be-compressed data set based on the mask data.

20. The electronic device according to claim 19, wherein the determining whether the to-be-compressed data set meets the preset mask setting condition includes:
determining a quantity of the data with the preset value in the to-be-compressed data set, and determining whether the to-be-compressed data set meets the preset mask setting condition based on the quantity and a preset quantity; and/or
determining whether the preset mask setting condition is met based on a pre-generated instruction indicating whether to generate the mask data, wherein the instruction is generated by pre-estimating the data with the preset value for the to-be-compressed data set before the to-be-compressed data set is obtained.

* * * * *